(12) United States Patent
Nagayama et al.

(10) Patent No.: US 8,395,316 B2
(45) Date of Patent: Mar. 12, 2013

(54) ORGANIC ELECTROLUMINESCENCE DISPLAY APPARATUS

(75) Inventors: Kohei Nagayama, Chiba (JP); Masami Iseki, Mobara (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 662 days.

(21) Appl. No.: 12/674,082

(22) PCT Filed: Jun. 15, 2009

(86) PCT No.: PCT/JP2009/061258
§ 371 (c)(1),
(2), (4) Date: Feb. 18, 2010

(87) PCT Pub. No.: WO2009/154288
PCT Pub. Date: Dec. 23, 2009

(65) Prior Publication Data
US 2011/0121753 A1      May 26, 2011

(30) Foreign Application Priority Data

Jun. 20, 2008   (JP) ................ 2008-162315

(51) Int. Cl.
*H05B 37/02*     (2006.01)
*H01L 51/52*     (2006.01)
(52) U.S. Cl. ...................... 313/506; 313/504
(58) Field of Classification Search ........... 313/495–512
See application file for complete search history.

(56) References Cited

U.S. PATENT DOCUMENTS

| 5,707,745 | A | 1/1998 | Forrest et al. | 428/432 |
| 6,320,322 | B1 | 11/2001 | Tanaka | 315/169.3 |
| 7,449,351 | B2 | 11/2008 | Yamada | 438/29 |
| 7,508,482 | B2 | 3/2009 | Son et al. | 349/187 |
| 2006/0017371 | A1 | 1/2006 | Yamada | 313/498 |
| 2007/0273294 | A1 | 11/2007 | Nagayama | 315/169.3 |

FOREIGN PATENT DOCUMENTS

| JP | 05-101891 | | 4/1993 |
| JP | 2000-195664 | | 7/2000 |
| JP | 2005174639 | A * | 6/2005 |
| JP | 2005-294058 | | 10/2005 |
| JP | 2006-038987 | | 2/2006 |
| WO | WO 2007/004115 | A2 | 1/2007 |

* cited by examiner

*Primary Examiner* — Anh Mai
*Assistant Examiner* — Elmito Breval
(74) *Attorney, Agent, or Firm* — Fitzpatrick, Cella, Harper & Scinto (57) ABSTRACT

The present invention provides a stack type organic electroluminescence display apparatus which can be structured to be an active matrix type. The organic electroluminescence display apparatus of the active-matrix driving system includes: a display region having a plurality of pixels each of which includes at least two subpixels, wherein the subpixels have three or more light-emitting devices stacked thereon each of which is configured by sandwiching between electrodes an organic layer including an emission layer, and any of the emission layers emits a light of different colors from each other and is commonly formed in all pixels; and a circuit for applying voltage to between the electrodes of the light-emitting device, wherein at least one light-emitting device among the stacked light-emitting devices is nonemission-treated.

22 Claims, 7 Drawing Sheets

ORGANIC ELECTROLUMINESCENCE DISPLAY APPARATUS

TECHNICAL FIELD

The present invention relates to an organic electroluminescence display apparatus which makes an emission layer emit light by sandwiching an organic layer including the emission layer with a pair of electrodes and applying a voltage between both electrodes.

BACKGROUND ART

A multicolor light-emitting device is proposed in which a plurality of light-emitting devices are stacked (U.S. Pat. No. 5,707,745). In the multicolor light-emitting device disclosed in this document, the stacked light-emitting devices are divided from each other by a transparent electroconductive layer so that each light-emitting device can be individually driven. When having three layers of emission layers stacked therein, for instance, the multicolor light-emitting device results in having a structure in which a first emission layer is sandwiched between a first electrode and a second electrode, a second emission layer is sandwiched between the second electrode and a third electrode, and a third emission layer is sandwiched between the third electrode and a fourth electrode. The multicolor light-emitting device also has a structure in which three power sources for individually driving the three layers of the emission layers are connected to the respective layers, and the power sources are connected in series because the second electrode and the third electrode are common between upper and lower emission layers.

An active matrix type electroluminescence display apparatus using a TFT is known. In the electroluminescence display apparatus, the light-emitting luminance of the device is controlled by an electric current, and a TFT for controlling the electric current and a switching TFT for selecting a pixel are arranged in each pixel. The driving voltage per one layer of a general organic electroluminescence device is approximately 5 V, and the threshold Vth of the TFT is approximately 2 V.

When the structure in the above described document is formed to be the active matrix type, it is assumed that three pixel circuits are provided in one pixel. Specifically, three current control TFTs and three switching TFTs are arranged in one pixel. A case will now be described below in which the current control TFT is an n-type and the first electrode is connected to GND.

When all three layers of the first, second and third emission layers are turned off, 0 V is applied to the gates of all current control TFTs. When making all of the three layers of the first, second and third emission layers emit light, 7 V including the threshold Vth is applied to the gate of the current control TFT for the first emission layer. Similarly, 12 V is applied to the gate of the current control TFT for the second emission layer, and 17 V is applied to the gate of the current control TFT for the third emission layer. This is because the potential difference between the first electrode and the fourth electrode is 15 V at the maximum, though a potential difference to be applied to each of the emission layer is 5 V.

Accordingly, the data signal voltage for controlling the current control TFT is in a range from 0 V to 17 V. The data signal voltage is applied to through the switching TFT for selecting a pixel, so that the switching TFT needs to have a withstand voltage of 17 V between the source and the drain.

Generally, the TFT to be formed on a glass substrate has a withstand voltage of 10 V to 15 V between the source and the drain. Therefore, when the structure in the above described document is formed to be the active matrix type, the structure causes a problem that the voltage applied to between the source and the drain of the switching TFT exceeds its withstand voltage.

DISCLOSURE OF THE INVENTION

The present invention has been made in order to solve the above described problem in a conventional technology, and is directed at providing a stack type organic electroluminescence display apparatus which can be formed to be an active matrix type.

The organic electroluminescence display apparatus in an organic electroluminescence display apparatus of an active-matrix driving system according to the present invention includes:

a display region having a plurality of pixels each of which includes at least two subpixels, wherein the subpixels have three or more light-emitting devices stacked thereon each of which is configured by sandwiching between electrodes an organic layer including the emission layer, and any of the emission layers emits a light of different colors from each other and is commonly formed in all pixels; and a circuit for applying voltage between the electrodes of the light-emitting device, wherein at least one light-emitting device among the stacked light-emitting devices is nonemission-treated.

Thereby, at least one light-emitting device among the stacked light-emitting devices is nonemission-treated, so that a data signal voltage to be supplied to one subpixel can be decreased. Therefore, the organic electroluminescence display apparatus can lower the withstand voltage between the source and the drain required for the switching TFT, and can be formed to be the active matrix type.

In addition, the organic electroluminescence display apparatus makes a light of a nonemission-treated luminescent color emitted from another subpixel, and accordingly can make the lights of all colors emitted from one pixel. The organic electroluminescence display apparatus also does not need to form organic emission layers having respective colors separately for every subpixel, and accordingly can simplify the process and reduce the cost.

Further features of the present invention will become apparent from the following description of examples with reference to the attached drawings.

BEST MODES FOR CARRYING OUT THE INVENTION

Examples of a display apparatus according to the present invention will now be described below with reference to the drawings.

A known or well-known art in the technical field shall be applied to a part which is not particularly shown or described in the present specification. In addition, each of the embodiments which will be described below is a single embodiment of the invention, and the invention is not limited to any of these embodiments.

Example 1

Figure 1:
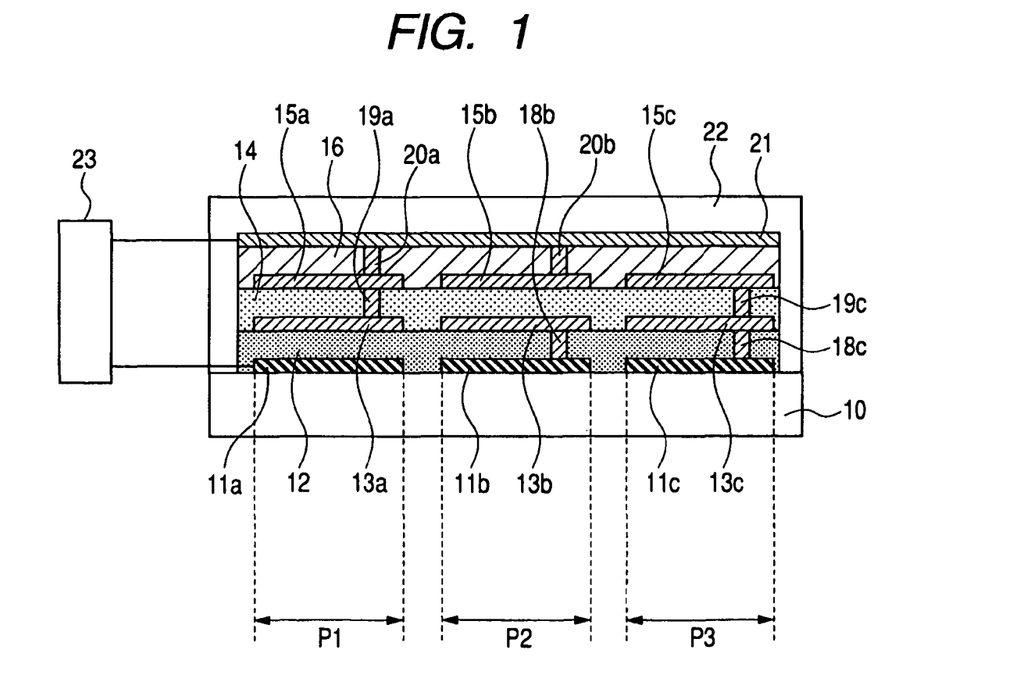
FIG. 1 is a schematic sectional view illustrating one pixel of an organic electroluminescence display apparatus according to Example 1 of the present invention.
Figure 2:
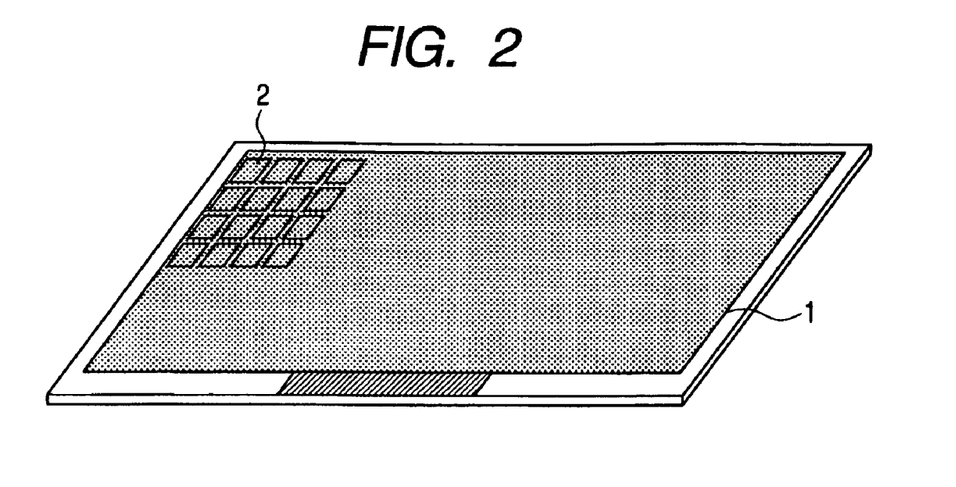
FIG. 2 is a schematic perspective view illustrating an organic electroluminescence display apparatus according to the present invention.

FIG. 1 is a view schematically illustrating a sectional structure in one pixel region of an organic electroluminescence display apparatus according to the present invention. A plurality of pixels 2 having the sectional structure illustrated in FIG. 1 is arranged in a matrix form, and constitute a display region 1 of the organic electroluminescence display apparatus illustrated in FIG. 2.

The structure and manufacturing method of the organic electroluminescence display apparatus of the present embodiment will now be described below with reference to FIG. 1.

In FIG. 1, three secondary pixels (hereinafter referred to as subpixel) P1, P2 and P3 are arranged in parallel in one pixel region. In FIG. 1, an insulative substrate 10 in which a pixel drive circuit including a TFT has been formed, first electrodes 11a, 11b and 11c, a first organic emission layer 12, second electrodes 13a, 13b and 13c, a second organic emission layer 14, third electrodes 15a, 15b and 15c, a third organic emission layer 16, fourth electrode 21, and contact holes 18a, 18b, 18c, 19a, 19b and 19c are shown.

Each of the subpixels P1, P2 and P3 is configured by stacking three types of the organic emission layers 12, 14 and 16 having different luminescent colors and the electrodes 11a, 11b, 11c, 13a, 13b, 13c, 15a, 15b, 15c and 21 which sandwich the respective organic emission layers. One light-emitting device includes three layers of each organic emission layers and a pair of electrodes which are arranged on the upper and lower sides so as to sandwich the organic emission layer. In this structure, three light-emitting devices are stacked. The three types of luminescent colors are red (R), green (G) and blue (B), and a stacked order of the colors is not limited in particular. The organic emission layer may employ any one of a one-layer type (emission layer), a two-layer type (emission layer/hole injection layer), a three-layers type (electron transport layer/emission layer/hole transport layer), a four-layers type (electron injection layer/emission layer/hole transport layer/hole injection layer) and a five-layers type (electron injection layer/electron transport layer/emission layer/hole transport layer/hole injection layer). In this stack structure, the electrodes 13a, 13b, 13c, 15a, 15b and 15c are commonly owned by the stacked upper and lower light-emitting devices. Each subpixel is a top emission type, and the second electrodes 13a, 13b and 13c, the third electrodes 15a, 15b and 15c and the fourth electrode have translucency.

In the present example, each of the organic emission layers has a three-layer structure, and includes the electron transport layer/the emission layer/the hole transport layer.

Because the following description is a well-known technology, the detailed description will be omitted, but a planarization film made from a resin is formed on an insulative substrate 10 having a switching device such as a TFT formed thereon, and a first electrode which has been patterned so as to correspond to each pixel region on the planarization film is formed thereon. The first electrode can be a light reflective member, and can be made from a material having high reflectivity, for instance, such as Cr, Al, Ag, Au and Pt.

However, the first electrode may have also a stack structure formed of a transparent electroconductive film such as ITO and IZO and a metallic thin film made from a material having high reflectivity, in order to enhance characteristics of injecting an electric charge into an adjacent organic emission layer. In a structure of this case, the metallic thin film may function only as a reflecting film.

Next, a method for manufacturing a structure of FIG. 1 will now be described.

In the whole area of a display region 1, each layer of first organic emission layers 12 is sequentially formed on an insulative substrate 10 on which first electrodes 11a, 11b and 11c have been formed with the use of a semiconductor process, by using a well-known technique such as a coating method and a vapor deposition method. At this time, each pixel is not separately coated by using a metal mask which has been used in a conventional process.

A material for each of the organic material layers constituting the organic emission layer can employ at least one type selected from among an organic light-emitting material, a hole injecting material, an electron injecting material, a hole transporting material and an electron transporting material. The organic emission layer may also have such a structure as to expand a range of selection for luminescent colors, by doping an organic light-emitting material into the hole injecting material or the hole transporting material, or by doping the organic light-emitting material into the electron injecting material or the electron transporting material. Furthermore, each organic material layer can be an amorphous film from the viewpoint of the light-emitting efficiency. A usable material for the organic light-emitting material includes a triarylamine derivative, a stilbene derivative, polyarylene, an aromatic condensation polycyclic compound, an aromatic heterocyclic compound, an aromatic heterocyclic condensation compound, a metal complex compound, and a single oligomeric body or a composite oligomeric body thereof. However, the constitution of the present invention is not limited to these materials. The organic emission layer has adequately a thickness of approximately 0.05 μm to 0.3 μm, and can have a thickness of approximately 0.05 to 0.15 μm. A usable material for the hole injecting material and the hole transporting material includes a phthalocyanine compound, a triarylamine compound, an electroconductive polymer, a perylene-based compound and an Eu complex, but the constitution of the present invention is not limited to these materials. A usable example of the electron injecting material and the electron transporting material includes Alq3 in which a trimer of 8-hydroxyquinoline has been coordinated to aluminum, a zinc azomethine complex and a distyryl biphenyl derivative, but the constitution of the present invention is not limited to these materials.

After the first organic emission layer 12 has been formed, contact holes 18b and 18c are formed thereon. A usable forming method can be a laser machining technique, and includes a well-known technique to be generally used for thin-film processing such as YAG laser (including SHG and THG) and an excimer laser. A contact hole can be formed at a desired position by irradiating the organic emission layer 12 with any of the laser beams to form a predetermined pattern through scanning the laser beam which has been focused into several micrometers, or irradiating it with a planar light source through a mask which makes the light transmit through a contact hole portion. The contact hole can have a diameter of 2 μm to 15 μm.

Subsequently, second electrodes 13a, 13b and 13c are formed with a patterning process. At this time, the first electrodes 11b and 11c are connected with the second electrodes 13b and 13c respectively through the contact holes 18b and 18c. The electrode material can be a material having high transmittance, and can be formed of, for instance, a transparent electroconductive film of ITO, IZO, ZnO or the like and an organic electroconductive film of polyacethylene or the like. The electrode material may also be a translucent film which has been formed from a metallic material such as Ag and Al so as to have a thickness of approximately 10 nm to 30 nm. The pattern can be formed with a method of having formed the electrode material in the whole region of the display region 1 and forming the pattern with the above described laser machining process, but may be also selectively formed with the use of a metal mask. The pattern may also be selectively transfer-formed with a laser ablation technique after having placed a substrate which has the electrode material formed thereon so as to oppose to the substrate 10.

Subsequently, a second organic emission layer 14, contact holes 19a and 19c, third electrodes 15a, 15b and 15c, a third organic emission layer 16 and contact holes 20a and 20b are sequentially formed with a similar method to the above described method.

Subsequently, a fourth electrode 21 is formed with a sputtering technique or the like. A material for the third electrode and the fourth electrode can be a material having high transmittance, similarly to that for the second electrode. An organic electroluminescence display apparatus was obtained by further forming the film of nitride oxide silicon as a protective film 22.

Figure 3:
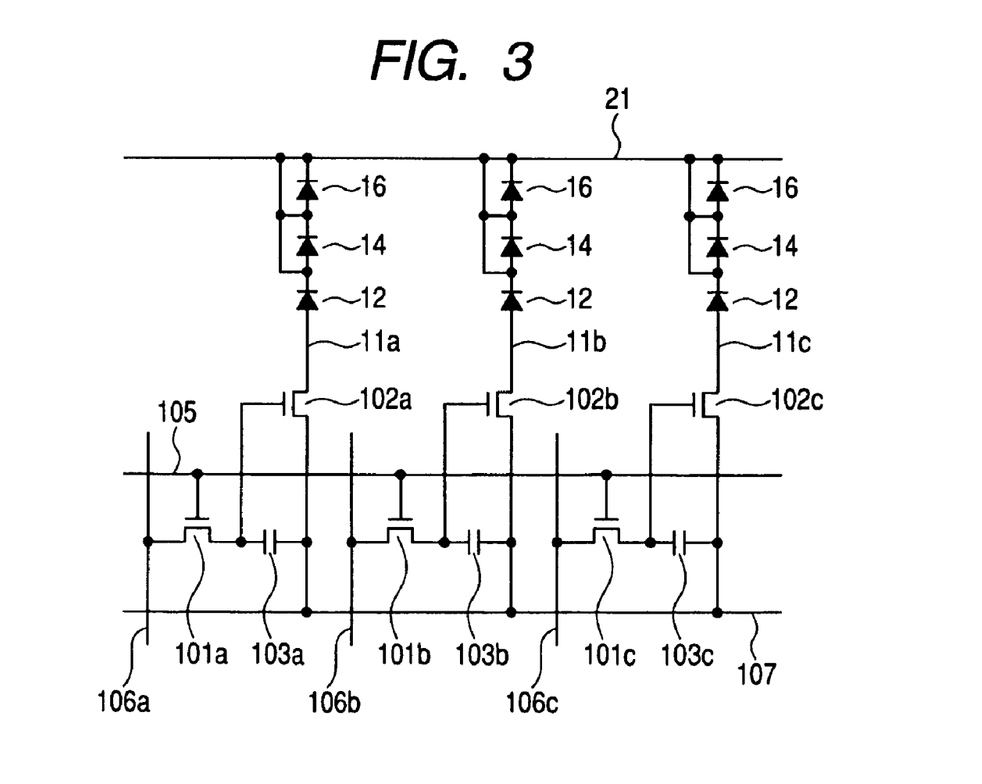
FIG. 3 is a view illustrating an equivalent circuit of an organic electroluminescence display apparatus according to Example 1 of the present invention.

FIG. 3 illustrates an equivalent circuit of an organic electroluminescence display apparatus which has been formed in this way. In a first subpixel P1, a second electrode is connected (short-circuited) with a third electrode through a contact hole 19a. In addition, the third electrode is connected (short-circuited) with a fourth electrode through a contact hole 20a. The light-emitting device of which the upper and lower electrodes have been short-circuited in this way acquires a structure in which effective voltage is not applied to an organic emission layer sandwiched between the electrodes, and accordingly does not emit an effective light. In the present invention, treatment for making the light-emitting device of one part of the stacked light-emitting devices not emit the effective light is referred to as nonemission treatment. In the present example, the short-circuiting between the upper and lower electrodes is the nonemission treatment. As a result of this nonemission treatment, the first subpixel P1 acquires a structure in which the effective voltage is applied only to a first organic emission layer. Similarly, a second subpixel P2 acquires a structure in which the effective voltage is applied only to a second organic emission layer 14, and a third subpixel P3 acquires a structure in which the effective voltage is applied only to a third organic emission layer 16. The "effective voltage" described here means a voltage to be applied to the light-emitting device so as to make the device emit a desired luminance of light, and shall exclude such an unintended voltage as to be generated by a leakage current or the like.

As was described above, in the present example, the organic emission layer to which voltage is applied is only one layer in each subpixel, and the voltage of a power supply unit 23 may be a voltage for one layer, in other words, may be approximately 5 V. Accordingly, the voltage can be reduced to one-third of a voltage in a conventional apparatus. Furthermore, the process can be simplified because organic emission layers 12, 14 and 16 do not need to be separately coated for every subpixel, unlike a conventional method. In addition, the aperture ratio of each subpixel can be increased because the light-emitting device has a stacked structure.

FIG. 3 illustrates a circuit of each pixel in an organic electroluminescence display apparatus according to the present example. Respective subpixels include switching TFTs 101a, 101b and 101c, driving TFTs 102a, 102b and 102c, stacked light-emitting devices and capacitors 103a, 103b and 103c.

Here, the gate electrodes of the switching TFTs 101a, 101b and 101c are connected to a gate signal line 105. The source regions of the switching TFTs 101a, 101b and 101c are connected to source signal lines 106a, 106b and 106c, and the drain regions thereof are connected to the gate electrodes of the driving TFTs 102a, 102b and 102c. The source regions of the driving TFTs 102a, 102b and 102c are connected also to a power supply line 107, and the drain regions thereof are connected also to electrodes 11a, 11b and 11c in one end of the light-emitting device. The other end of the light-emitting device is connected to a fourth electrode 21 (GND connection). The respective electrodes of capacitors 104a, 104b and 104c are formed so as to be connected to the gate electrodes of the driving TFTs 102a, 102b and 102c and to the power supply line 107 (potential 5 V). In this way, the driving TFTs 102a, 102b and 102c are connected to the light-emitting device in series, and an electric current passing through the light-emitting device is controlled by the driving TFTs 102a, 102b and 102c according to a data signal which is supplied from the source signal lines 106a, 106b and 106c. This pixel circuit employs a well-known circuit structure referred to as a current programming system, and the description of its detailed operation will be omitted. In the structure of the present example, each of the subpixels can be independently driven, so that the pixel can simultaneously emit the lights of three colors RGB.

Example 2

Figure 4:
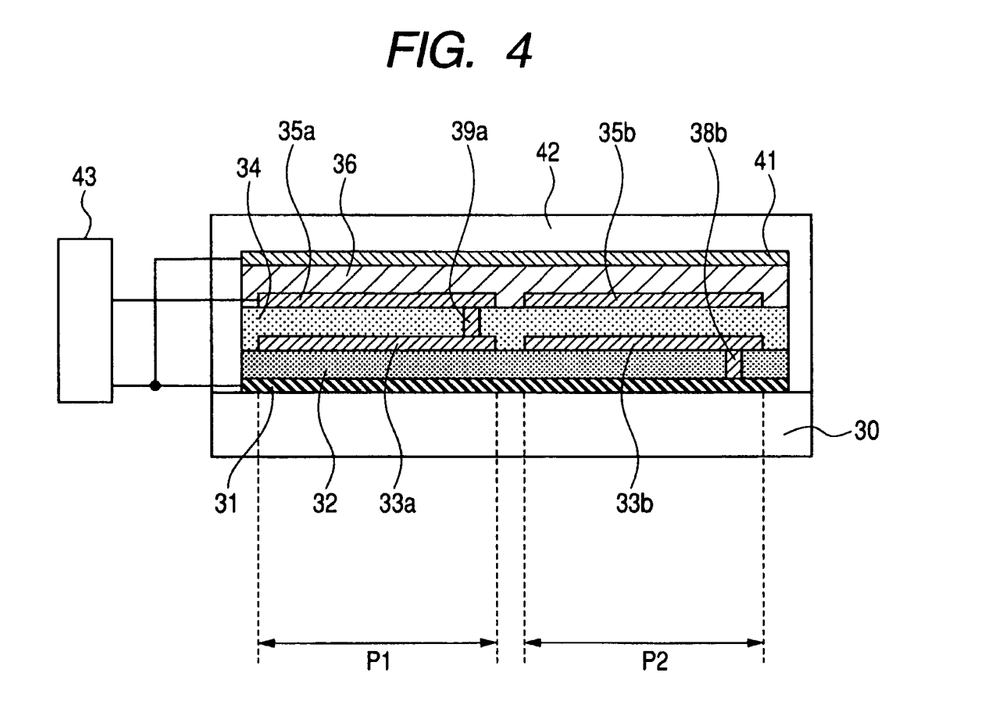
FIG. 4 is a schematic sectional view illustrating one pixel of an organic electroluminescence display apparatus according to Example 2 of the present invention.

FIG. 4 is a view schematically illustrating a sectional structure in one pixel region of an organic electroluminescence display apparatus according to Example 2 of the present invention. A display region 1 of the organic electroluminescence display apparatus illustrated in FIG. 2 includes a plurality of pixels having the sectional structure illustrated in FIG. 4 arranged therein in a matrix form. In FIG. 4, the organic electroluminescence display apparatus according to the present example is a top emission type. An insulative substrate 30 in which a pixel circuit including a TFT has been formed as needed is shown. A first electrode 31, a first organic emission layer 32, second electrodes 33a and 33b, a second organic emission layer 34, third electrodes 35a and 35b, a third organic emission layer 36, a fourth electrode 41 and contact holes 38b and 39a are shown. Each organic emission layer in the present example has a three-layer structure, and includes an electron transport layer/an emission layer/a hole transport layer. The material and the film-forming method of the organic emission layer and the electrode are similar to those in Example 1, and the detailed description will be omitted.

In the above described organic electroluminescence display apparatus, one pixel includes a first subpixel P1 and a second subpixel P2. The first electrode 31 is formed in the pixel region on the insulative substrate 30. The first electrode 31 and the fourth electrode 41 are common electrodes to the subpixels. The first electrode 31 and the fourth electrode 41 are connected with each other. They may be connected in the inside of the display region or in the outside of the display region. In both cases, the same voltage is supplied to the both electrodes.

In addition, the contact holes 38b and 39a are formed between the following electrodes with a laser machining technique. Thereby, the second electrode 33a and the third electrode 35a in the first subpixel P1 are connected (short-circuited), and the first electrode 31 and the second electrode 33b in the second subpixel P2 are connected (short-circuited), respectively. The short-circuiting process in the present example is a nonemission treatment, similar to that in the above described Example 1.

Figure 5:
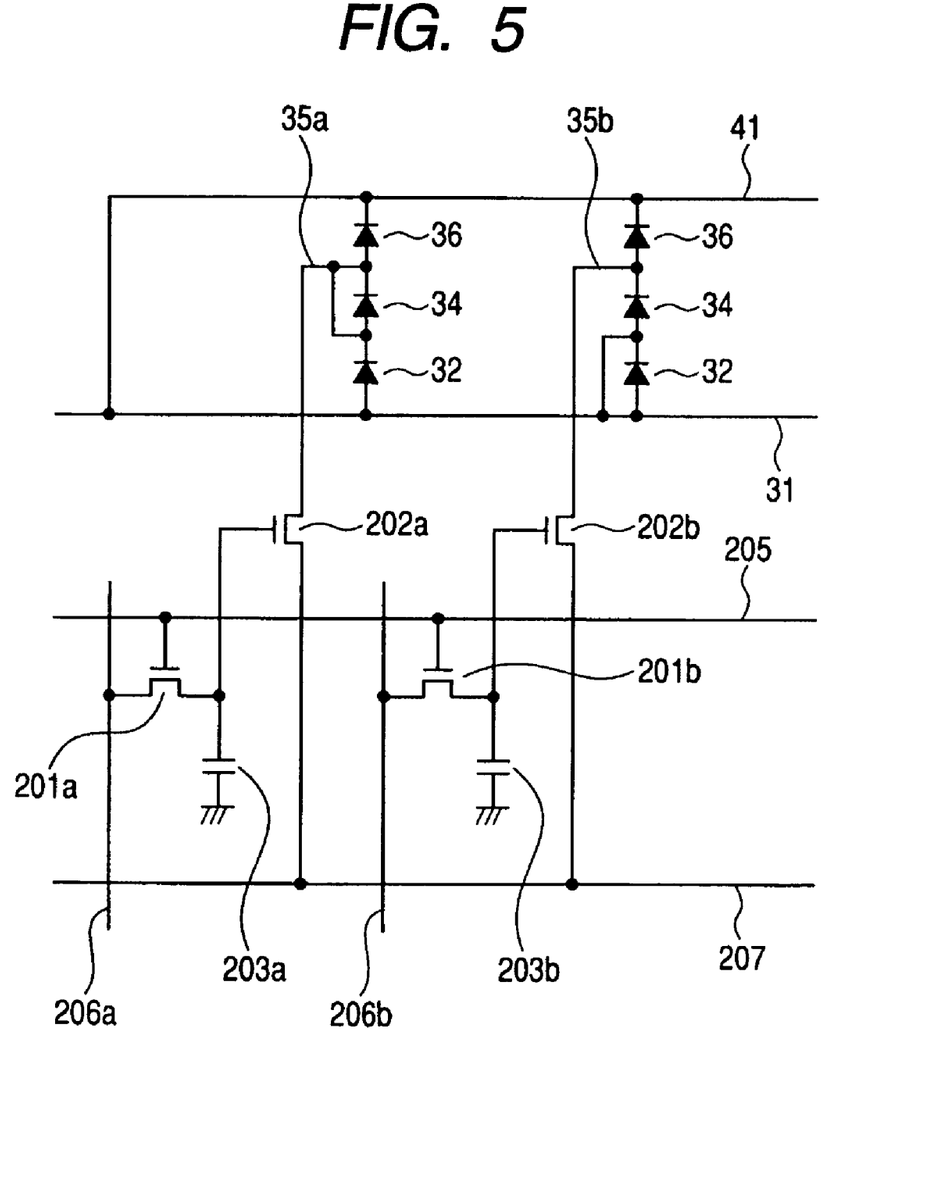
FIG. 5 is a view illustrating an equivalent circuit of an organic electroluminescence display apparatus according to Example 2 of the present invention.

FIG. 5 illustrates a circuit of each pixel in an organic electroluminescence display apparatus which has been formed in this way. Each subpixel includes switching TFTs 201a and 201b, driving TFTs 202a and 202b, stacked light-emitting devices and capacitors 203a and 203b. Here, the gate electrodes of the switching TFTs 201a and 201b are connected to a gate signal line 205. The source regions of the switching TFTs 201a and 201b are connected to source signal lines 206a and 206b, and the drain regions thereof are connected to the gate electrodes of the driving TFTs 202a and 202b. In addition, the source regions of the driving TFTs 202a and 202b are connected to a power supply line 207, and the drain regions thereof are connected to electrodes in one end of the light-emitting device. Specifically, the drain regions are connected to a third electrode 35a in a subpixel P1 of FIG. 4, and to a third electrode 35b in a subpixel P2 of FIG. 4. The electrodes in the other end of the light-emitting device are connected to a counter electrode 41. The capacitors 203a and 203b are formed so that the respective electrodes are connected to the gate electrodes of the driving TFTs 202a and 202b and to GND. Thus, the driving TFTs 202a and 202b are connected to the light-emitting device in series, and control the light emission by controlling an electric current passing through the light-emitting device according to a data signal which is supplied from the source signal lines 206a and 206b.

Figure 6:
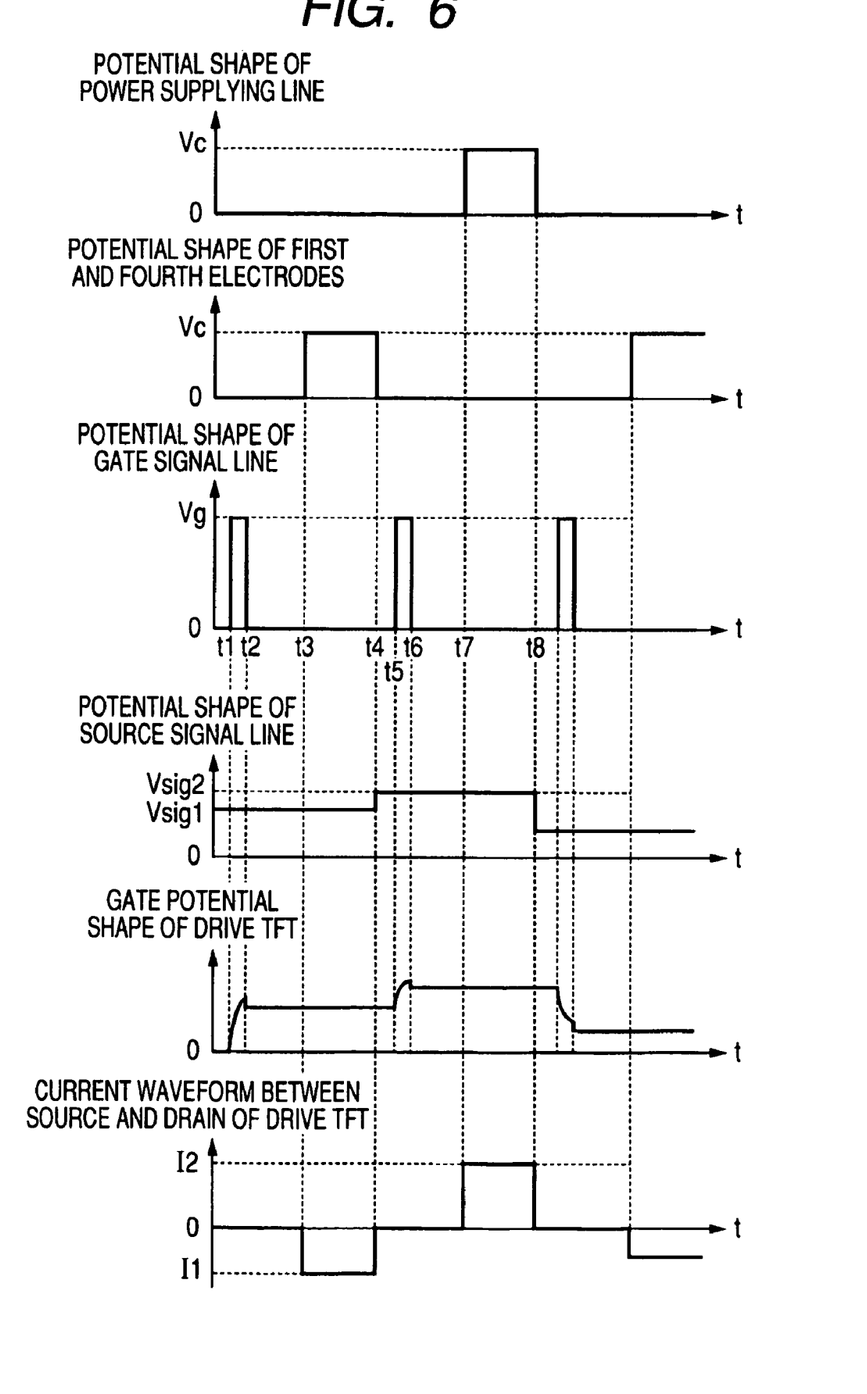
FIG. 6 is a driving waveform view for describing an operation of an equivalent circuit illustrated in FIG. 5.

Next, a method for driving an organic electroluminescence display apparatus according to the present example will now be described with reference to FIG. 6. FIG. 6 is a view illustrating one example of a drive waveform of an organic electroluminescence display apparatus.

When the potential of a gate signal line 205 is set at Vg at time t1, switching TFTs 201a and 201b are switched to an ON state. Thereby, a potential Vsig 1 of source signal lines 206a and 206b is charged in capacitors 203a and 203b and in the gate capacitance of driving TFTs 202a and 202b, through the switching TFTs 201a and 201b.

When the potential of the gate signal line 205 is set at 0 V at time t2, the switching TFTs 201a and 201b are switched to an OFF state, and the voltage which has been charged in the capacitors 203a and 203b is held therein.

The potentials of a first electrode 31 and a fourth electrode 41 are set at Vc at time t3. At this time, a power supply line 207 is kept at 0 V, so that a potential difference is generated between the organic emission layers, and between the source and the drain of each of the driving TFTs 202a and 202b. Thereby, electrons are injected into a first organic emission layer 32 and a second organic emission layer 34 from a second electrode 33a and a third electrode 35b, and holes are simultaneously injected thereto from the first electrode 31 and a second electrode 33b. Then, light emission is obtained. This emission light is ejected from a protective layer 42 side. A third organic emission layer 36 does not emit light, because the voltage of a reverse direction is applied thereto. An electric current passing through the organic emission layer is controlled by the driving TFTs 202a and 202b, and an electric current I1 passes between the sources and the drains of the driving TFTs 202a and 202b according to the voltage which has been charged in the capacitors 203a and 203b. This state is kept up to time t4.

At the time t4, the potentials of the first electrode 31 and the fourth electrode 41 are set at 0 V. Then, the potential difference which had existed between the organic emission layers and the source and the drain of each of the driving TFTs 202a and 202b disappears, so that the first organic emission layer 32 and the second organic emission layer 34 stop emitting light. Subsequently, a signal Vsig 2 for making the third organic emission layer emit light is set to source signal lines 206a and 206b.

When the potential of the gate signal line 205 is set at Vg at time t5, the switching TFTs 201a and 201b are switched to the ON state. Thereby, a potential Vsig 2 of the source signal lines 206a and 206b is charged in the capacitors 203a and 203b and in the gate capacitance of the driving TFTs 202a and 202b, through the switching TFTs 201a and 201b.

When the potential of the gate signal line 205 is set at 0 V at time t6, the switching TFTs 201a and 201b are switched to the OFF state, and the voltage which has been charged in the capacitors 203a and 203b is held therein.

At time t7, the potential of the power supply line 207 is set at Vc. At this time, the potentials of the first electrode 31 and the fourth electrode 41 are kept at 0 V, so that a potential difference is generated between the organic emission layers and between the source and the drain of each of the driving TFTs 202a and 202b. Thereby, electrons are injected into the third organic emission layer 36 from the fourth electrode 41, and simultaneously holes are injected thereto from the third electrodes 35a and 35b. When, excited organic molecules are relaxed to a base state by the recombination of the electrons and the holes, light emission is obtained. This emission light is ejected from the protective layer 42 side. The first organic emission layer 32 and the second organic emission layer 34 do not emit light, because the voltage in a reverse direction is applied thereto. An electric current passing through the organic emission layer is controlled by the driving TFTs 202a and 202b, and an electric current I2 passes between the sources and the drains of the driving TFTs 202a and 202b, according to the voltage which has been charged in the capacitors 203a and 203b. This status is kept up to time t8.

At time t8, the potential of the power supply line 207 is set at 0 V. Then, the potential difference which had existed between the organic emission layers and the source and the drain of each of the driving TFTs 202a and 202b disappears, so that the third organic emission layer 36 stops emitting light.

The organic emission layers 32, 34 and 36 can emit light by time division by repeating the above described operation. Specifically, a power supply unit 43 drives the organic electroluminescence display apparatus in a cycle of a degree which cannot be recognized by humans, for instance, of approximately 60 Hz or higher. Thereby, the organic electroluminescence display apparatus can express a light of an arbitrary mixed color among luminescent colors of the first organic emission layer 32, the second organic emission layer 34 and the third organic emission layer 36.

In such an organic electroluminescence display apparatus, an organic electroluminescence layer to which voltage is applied is only one layer, and the power supply unit 43 may supply a voltage for one layer, in other words, of approximately 5 V. Accordingly, the voltage can be reduced to one-third of a voltage in a conventional apparatus. Furthermore, the organic emission layers 32, 34 and 36 does not need to be separately coated, and the number of subpixels is two which is less than that in Example 1, so that the aperture ratio can be increased.

Example 3

Figure 7:
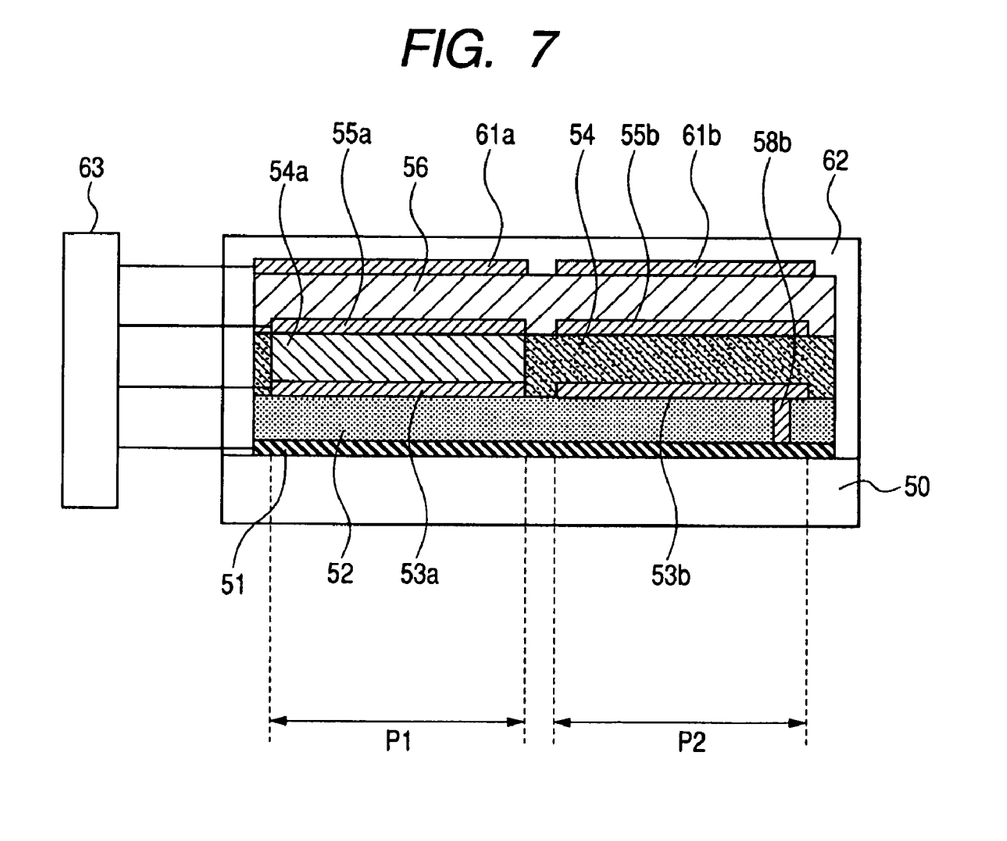
FIG. 7 is a schematic sectional view illustrating one pixel of an organic electroluminescence display apparatus according to Example 3 of the present invention.

FIG. 7 is a view schematically illustrating a sectional structure in one pixel region of an organic electroluminescence display apparatus according to Example 3 of the present invention. A display region 1 of the organic electroluminescence display apparatus illustrated in FIG. 2 includes a plurality of pixels which have the sectional structure illustrated in FIG. 7 and are arranged therein in a matrix form. In FIG. 7, the organic electroluminescence display apparatus according to Example 3 is a top emission type. An insulative substrate 50 in which a pixel circuit including a TFT has been formed as needed is shown. A first electrode 51, a first organic emission layer 52, second electrodes 53a and 53b, a second organic emission layer 54, third electrodes 55a and 55b, a third organic emission layer 56, a fourth electrode 61 and a contact hole 58b are shown. The organic emission layer in the present example has a three-layer structure, and includes an electron transport layer/an emission layer/a hole transport layer. The material and the film-forming method of the organic emission layer and the electrode are similar to those in Example 1, so that the detailed description will be omitted.

One pixel of the above described organic electroluminescence display apparatus includes a first subpixel P1 and a second subpixel P2.

The first electrode is formed in the pixel region on the insulative substrate 50. The first electrode 51 and the fourth electrode 61 are common electrodes to the subpixels.

The contact hole 58b is formed in the first organic emission layer with a laser machining technique. Thereby, the first electrode 51 and the second electrode 53b in the second subpixel P2 are connected (short-circuited).

The second organic emission layer 54 is subjected to high resistance treatment in the first subpixel P1. This high resistance treatment is nonemission treatment. Specifically, after the second organic emission layer 54 has been formed, a portion in the first subpixel P1 is irradiated with ultra-violet rays to form a non-luminescent second organic emission layer 54a. The light can be ultraviolet rays. The portion may be irradiated with a general UV ray emitted from a mercury lamp while a mask is used, or with an ultraviolet light laser such as an excimer laser.

The third organic emission layer 56 is subjected to the nonemission treatment in the second subpixel P2. Specifically, after the fourth electrode 61 has been formed, the periphery of the fourth electrode is removed with a laser machining technique to make the fourth electrode a floating electrode 61b.

In the structure according to Example 3, emission layers which emit light are the first organic emission layer 52 and the third organic emission layer 56 in the first subpixel P1 and the second organic emission layer 54 in the second subpixel P2.

In addition, the light emission of each light-emitting device is controlled by applying 5 V to between the first electrode 51 and the fourth electrode 61 and controlling potentials of the second electrode 53a and the third electrodes 55a and 55b to the range of 0 V to 5 V, with a power supply unit 63.

Figure 8:
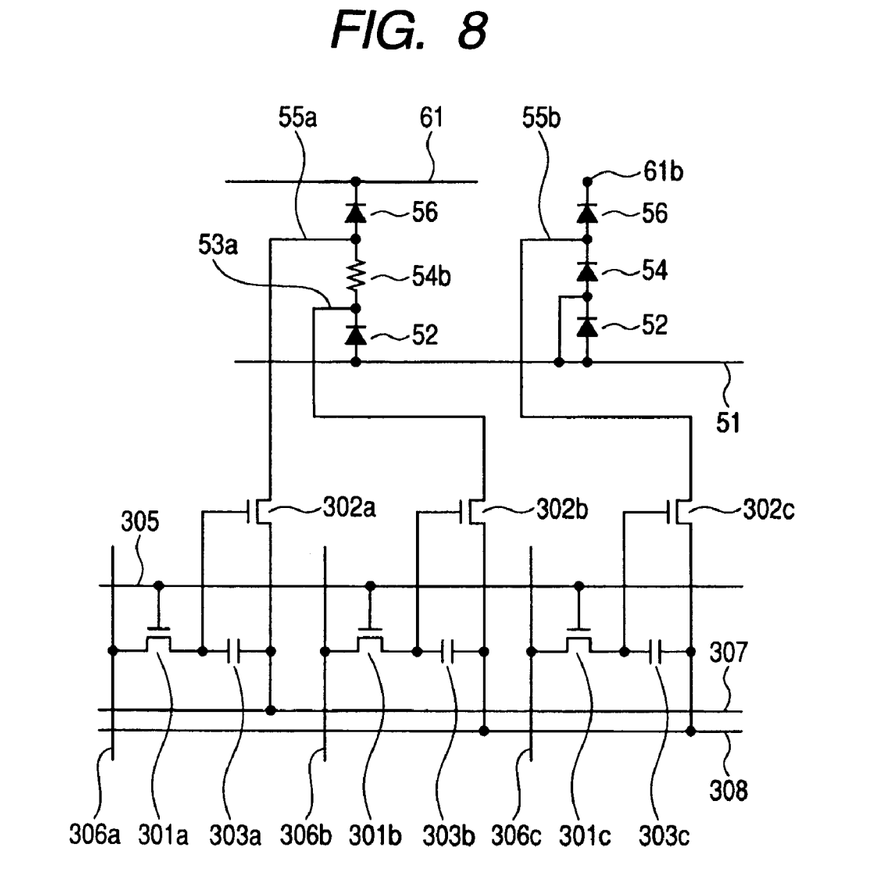
FIG. 8 is a view illustrating an equivalent circuit of an organic electroluminescence display apparatus according to Example 3 of the present invention.

Next, FIG. 8 illustrates a circuit of each pixel in this organic electroluminescence display apparatus. In a first subpixel P1, the power supply unit applies voltage to a second electrode 53a and a first electrode 51 to make a first organic emission layer 54 emit light, and applies voltage to between a third electrode 55a and a fourth electrode 61 to make a third organic emission layer 56 emit light. A potential difference between the second electrode 53a and the third electrode 55a is 5 V at the maximum. A second organic emission layer 54a is made to have high resistance, so that electrons are not injected to the second organic emission layer from the third electrode 55a at the potential difference of 5 V.

In a second subpixel P2, a second electrode 53b is connected (short-circuited) to the first electrode 51 through a contact hole 58b, so that the second organic emission layer 54 is structured so as to emit light by a voltage applied to between a third electrode 55b and the second electrode 53b. A fourth electrode 61b is formed into a floating state by the above described nonemission treatment, so that voltage is not applied to the third organic emission layer 56, which does not give an influence to the light emission of the second organic emission layer 54.

In such an organic electroluminescence display apparatus, an organic electroluminescence layer to which voltage is applied is only one layer, and a power supply unit 63 may supply a voltage for one layer, in other words, of approximately 5 V. Accordingly, the voltage can be reduced to one-third of a voltage in a conventional apparatus. Furthermore, the organic emission layers 52, 54 and 56 do not need to be separately coated, and the subpixels are two which is less than those in Example 1, so that the aperture ratio can be increased.

The structure of a pixel circuit of an organic electroluminescence display apparatus according to the present example is similar to that in Example 1, but has two power supply lines therein. The potential of a first power supply line 307 is set at 5 V, and the potential of a second power supply line 308 is set at 0 V.

The first power supply line 307 is connected to a source of a driving TFT 302a, and the second power supply line 308 is connected to drain regions of driving TFTs 302b and 302c. The drain region of the driving TFT 302a and the source regions of the driving TFTs 302b and 302c are connected to electrodes 55a, 53a and 55b in one end of a light-emitting device, respectively.

The other electrode of the light-emitting device is connected to a control electrode corresponding to each of organic emission layers in FIG. 8, in other words, to a first electrode 51 (potential 5 V) and a fourth electrode 61 (GND connection). The driving TFTs 302a, 302b and 302c and the light-emitting device are connected in series, and the driving TFTs 302a, 302b and 302c control an electric current passing through the light-emitting device.

While the present invention has been described with reference to examples, it is to be understood that the invention is not limited to the disclosed examples.

This application claims the benefit of Japanese Patent Application No. 2008-162315, filed Jun. 20, 2008, which is hereby incorporated by reference in its entirety.

The invention claimed is:

1. An organic electroluminescence display apparatus of an active-matrix driving system comprising:
   a display region having a plurality of pixels, each of which comprises a first subpixel, a second subpixel and a third subpixel, wherein the subpixels have three or more light-emitting devices stacked thereon, each of which is configured by sandwiching between electrodes an organic layer including an emission layer, and any of the emission layers emits a light of different colors from each other and is commonly formed in all pixels, wherein at least one light-emitting device among the stacked light-emitting devices is non-emission-treated, wherein the light-emitting device which is non-emission-treated in the respective subpixels is different from that in other subpixels, wherein the light-emitting devices which emit different luminescent colors from each other are light-emitting devices which emit three types of luminescent colors of red, blue and green, and wherein a light-emitting device which is non-emission-treated in the first subpixel is green, a light-emitting device which is non-emission-treated in the second subpixel is red, and a light-emitting device which is non-emission-treated in the third subpixel is blue; and a circuit for applying voltage between the electrodes of the light-emitting device.

2. The organic electroluminescence display apparatus of an active-matrix driving system according to claim 1, wherein the light-emitting device which is non-emission-treated is nonemission-treated by imparting high resistance to at least one part of the organic layer.

3. The organic electroluminescence display apparatus of the active-matrix driving system according to claim 2, wherein the high resistance is imparted to the organic layer by irradiating the organic layer with ultraviolet rays.

4. The organic electroluminescence display apparatus of the active-matrix driving system according to claim 1, wherein an organic layer other than the emission layer of the light-emitting device is commonly formed in all regions of a display region which includes all of the pixels.

5. The organic electroluminescence display apparatus of the active-matrix driving system according to claim 1, wherein one part of the electrodes of the stacked light-emitting devices is shared by the light-emitting devices.

6. The organic electroluminescence display apparatus of the active-matrix driving system according to claim 1, wherein the light-emitting device which is non-emission-treated is non-emission-treated by causing one of two electrodes which sandwich the organic layer to be in a floating state.

7. The organic electroluminescence display apparatus of the active-matrix driving system according to claim 6, wherein the floating state is caused by patterning one electrode.

8. The organic electroluminescence display apparatus of the active-matrix driving system according to claim 1, wherein the light emission of a light-emitting device which is not non-emission-treated in the same subpixel is controlled at the same time.

9. The organic electroluminescence display apparatus of the active-matrix driving system according to claim 1, wherein the light emission of the light-emitting device which is not non-emission-treated in the same subpixel is controlled by time division.

10. The organic electroluminescence display apparatus of the active-matrix driving system according to claim 1, wherein the organic layer has at least one of a hole transport layer, a hole injection layer, an electron transport layer and an electron injection layer other than the emission layer.

11. The organic electroluminescence display apparatus of an active-matrix driving system according to claim 1, wherein the light-emitting device which is non-emission-treated is nonemission-treated by short-circuiting two electrodes which sandwich the organic layer, and the short-circuiting is performed by processing one part of the organic layer with the use of a laser beam.

12. An organic electroluminescence display apparatus of an active-matrix driving system comprising:

a display region having a plurality of pixels, each of which comprises a first subpixel and a second subpixel, wherein the subpixels have three or more light-emitting devices stacked thereon, each of which is configured by sandwiching between electrodes an organic layer including an emission layer, and any of the emission layers emits a light of different colors from each other and is commonly formed in all pixels, wherein the light-emitting devices which emit different luminescent colors from each other are light-emitting devices which emit three types of luminescent colors of red, blue and green, wherein at least one light-emitting device among the stacked light-emitting devices is non-emission-treated, wherein a light-emitting device which is non-emission-treated in the first subpixel is green, and wherein a light-emitting device which is non-emission-treated in the second subpixel is red; and a circuit for applying voltage between the electrodes of the light-emitting device.

13. The organic electroluminescence display apparatus of an active-matrix driving system according to claim 12, wherein the light-emitting device which is non-emission-treated is non-emission-treated by imparting high resistance to at least one part of the organic layer.

14. The organic electroluminescence display apparatus of the active-matrix driving system according to claim 13, wherein the high resistance is imparted to the organic layer by irradiating the organic layer with ultraviolet rays.

15. The organic electroluminescence display apparatus of the active-matrix driving system according to claim 12, wherein an organic layer other than the emission layer of the light-emitting device is commonly formed in all regions of a display region which includes all of the pixels.

16. The organic electroluminescence display apparatus of the active-matrix driving system according to claim 12, wherein one part of the electrodes of the stacked light-emitting devices is shared by the light-emitting devices.

17. The organic electroluminescence display apparatus of the active-matrix driving system according to claim 12, wherein the light-emitting device which is non-emission-treated is non-emission-treated by causing one of two electrodes which sandwich the organic layer to be in a floating state.

18. The organic electroluminescence display apparatus of the active-matrix driving system according to claim 17, wherein the floating state is caused by patterning one electrode.

19. The organic electroluminescence display apparatus of the active-matrix driving system according to claim 12, wherein the light emission of a light-emitting device which is not non-emission-treated in the same subpixel is controlled at the same time.

20. The organic electroluminescence display apparatus of the active-matrix driving system according to claim 12, wherein the light emission of the light-emitting device which is not non-emission-treated in the same subpixel is controlled by time division.

21. The organic electroluminescence display apparatus of the active-matrix driving system according to claim 12, wherein the organic layer has at least one of a hole transport layer, a hole injection layer, an electron transport layer and an electron injection layer other than the emission layer.

22. The organic electroluminescence display apparatus of an active-matrix driving system according to claim 12, wherein the light-emitting device which is non-emission-treated is non-emission-treated by short-circuiting two electrodes which sandwich the organic layer, and the short-circuiting is performed by processing one part of the organic layer with the use of a laser beam.

* * * * *